United States Patent [19]
Seabaugh

[11] Patent Number: 5,234,848
[45] Date of Patent: Aug. 10, 1993

[54] METHOD FOR FABRICATING LATERAL RESONANT TUNNELING TRANSISTOR WITH HETEROJUNCTION BARRIERS

[75] Inventor: Alan C. Seabaugh, Richardson, Tex.

[73] Assignee: Texas Instruments Incorporated, Dallas, Tex.

[21] Appl. No.: 787,850

[22] Filed: Nov. 5, 1991

[51] Int. Cl.⁵ .......................................... H01L 21/302
[52] U.S. Cl. ..................................... 437/40; 437/126; 437/133; 437/203
[58] Field of Search ............... 257/20, 24, 25; 437/40, 437/133, 203, 41, 126, 109

[56] References Cited

U.S. PATENT DOCUMENTS

| | | | |
|---|---|---|---|
| 4,746,626 | 5/1988 | Eda et al. | 437/107 |
| 4,758,870 | 7/1988 | Hase et al. | |
| 4,783,427 | 11/1988 | Reed et al. | 437/90 |
| 4,908,325 | 3/1990 | Berenz et al. | 437/40 |
| 4,927,782 | 5/1990 | Davey et al. | 437/184 |
| 5,026,655 | 6/1991 | Ohata | 437/40 |
| 5,077,231 | 12/1991 | Plumton et al. | 437/51 |
| 5,141,879 | 8/1992 | Goronkin et al. | 437/29 |

FOREIGN PATENT DOCUMENTS

| | | | |
|---|---|---|---|
| 0226383 | 6/1987 | European Pat. Off. | |
| 62-1268 | 1/1987 | Japan | 437/126 |
| 2-98946 | 4/1990 | Japan | 437/133 |

OTHER PUBLICATIONS

Chou, S. et al., "Lateral Resonant Tunneling transistors ...", *Proceedings of the IEEE*, vol. 79, No. 8, Aug. 1991, pp. 1131-1139.
Huang, Q. et al., "Analysis of Channel Mos controlled ...", *IEEE Trans. Electron Devices*, vol. 38, No. 7, Jul. 1991, pp. 1612-1618.
Ide, Y. et al., "Sidewall growth by atomic layer epitaxy," *Appl. Phys. Lett.*, 53(23), 5 Dec. 1988, pp. 2314-2316.
Broekaert, B., et al., "Extremely High Current Density ...", *IEEE IEDM/Tech, Digest*, 1989, pp. 559-562.
Broekaert, B., et al., "Pseudomolphic $In_{0.53}Ga_{0.47}$...", *Appl. Phys. Lett.*, 53(16), 17 Oct. 1988, pp. 1545-1547.
Broekaert, B., et al., "AlAs Etch-Stop Layers ...", *IEEE IEDM Tech. Digest*, 1990, pp. 339-342.
Seabaugh, A., et al., "Pseudomophic Bipolar Quamtum ...", *IEEE Transactions on Electron Devices*, vol. 36, No. 10, Oct. 1989, pp. 2328-2334.
Seabaugh, A., et al., "Quantum-Well Resonant-Tunneling Trans ...", *Twelth Biennial Conf. Adv. Concepts High Speed ...* Aug. 7-9, 1989, pp. 1-16.
Seabaugh, A. et al., "Room Temperature Hot Electron ...", *Japanese J. Appl. Phys.*, vol. 30, No. S, May 1991, pp. 921-925.
Yamamoto, T., et al., "Buried Rectangular GaInAs/InP ...", *Electronics Letters*, vol. 26, No. 13, 21st Jun. 1990, pp. 875-876.
Yang, C., et al., "New field-effect resonant ...", *Appl. Phys. Lett.* 55(26), 25 Dec. 1989, pp. 2742-2744.

*Primary Examiner*—T. N. Quach
*Attorney, Agent, or Firm*—Chris D. Pylant; Richard A. Stoltz; James C. Kesterson

[57] ABSTRACT

A lateral resonant tunneling transistor is provided comprising heterojunction barriers (24) and a quantized region (33). Current between source contact (26) and drain contact (28) can be switched "ON" or "OFF" by placing an appropriate voltage on gate contacts (30) and (32). The potential on gate contacts (30) and (32) selectively modulate the quantum states within quantized region (33) so as to allow electrons to tunnel through heterojunction barrier (24) and quantized region (33). The method for fabricating comprises etching trenches through second barrier layer (20) and quantum layer (16) and regrowing a semiconductor to form heterojunction barrier (24).

4 Claims, 3 Drawing Sheets

METHOD FOR FABRICATING LATERAL RESONANT TUNNELING TRANSISTOR WITH HETEROJUNCTION BARRIERS

NOTICE

The U.S. Government has a paid-up license in this invention and the right in limited circumstances to require the patent owner to license others on reasonable terms as provided for by the terms of Contract No. 91-0936-01, Office of Naval Research, and Contract No. FO-8630-91-C-0012, Air Force Write Laboratory.

RELATED APPLICATIONS

This application is related to an application entitled "UNIVERSAL QUANTUM DOT LOGIC CELL", U.S. patent application Ser. No. 07/811,557, filed Nov. 5, 1991.

TECHNICAL FIELD OF THE INVENTION

This invention relates in general to the field of electronic devices and more particularly to an improved lateral resonant tunneling transistor.

BACKGROUND OF THE INVENTION

Integrated circuits have become the technology of choice for performing electronic functions. The downscaling of minimum device geometries has provided for increases in the functional density of electronic devices. The development of nanoelectronic devices has allowed for the continuing increase in functional density of integrated electronic systems beyond the currently perceived limits for conventional electron devices. The term "nanoelectronics" refers to an integrated circuit technology that permits downscaling of minimum circuit geometries to an order of 0.01 microns.

In nanoelectronics, the behavior of electrons in semiconductors can be understood by considering the wave-like properties of electrons. Two important electron quantum phenomena that can be observed are "tunneling", whereby electrons pass through potential energy barriers, and "resonance", whereby steady state tunneling current is substantially reinforced because of the dimensions of quantized regions through which electrons tunnel. Tunneling and resonance are observed when certain quantum states between adjacent regions are aligned.

To date, several different devices, including diodes and transistors, have been disclosed which make use of these quantum effects. For example, Chou, Allee, Pease, and Harris have disclosed such a device in their paper "Lateral Resonant Tunneling Transistors Employing Field-Induced Quantized regions and Barriers," *Proceedings of the IEEE*, Volume 79, No. 8, Aug. 1991, pp. 1131-1139. another example, Yang, Kao, and Shih discussed a Stark-Effect Transistor in their paper "New Field Effect Resonant Tunneling Transistor: Observations of Oscillatory Transconductance," *Appl. Phys. Lett.* 55 (26N), 25 Dec. 1989, pp. 2742-2744.

Although advances have been made in the development of quantum effect devices, a significant area in which progress has been slow is that of digital electronics. Devices which may have applications in digital circuits have been disclosed, but have significant limitations. For example, devices such as those disclosed by Chou, et al. display certain characteristics of semiconductor switching devices Through use of electric fields, quantized regions can be created between depletion-region-potential-barriers, and resonant tunneling can be observed. Thus, electric current can be switched on or off, depending upon the strength of the electric fields. The performance of such devices, however, is highly dependent upon precise dopant concentrations, and they must be operated only at low temperatures. Devices such as those disclosed by Yang, et al. make use of physical, horizontal potential barriers In such devices, current flow is effected through use of electric fields generated between front and back gates.

None of the prior art devices provide for quantized regions disposed between non-horizontal physical tunneling barriers, such that quantum states can be separately—and thus digitally—modulated to allow electron tunneling. Thus, a need has arisen for a device that makes use of non-horizontal physical tunneling barriers, such that quantum states of quantized regions existing between the non-horizontal physical tunneling barriers may be modulated by electric fields to allow for current switching. Further, conventional lateral resonant tunneling transistors do not operate at room temperature.

SUMMARY OF THE INVENTION

In accordance with the teachings of the present invention, a lateral resonant tunneling transistor with heterojunction barriers is provided which comprises at least one quantized region disposed between non-horizontal heterojunction tunneling barriers. Electric fields generated by placing potentials on a gate structure disposed insulatively adjacent to each quantized region allow for adjustment of quantum states within the quantized regions. By aligning the quantum states within the quantized regions with the available potential state of electrons at a source and a drain, electrons can be made to tunnel through the quantized regions. Thus, in operation, the present invention acts as a current switching device, depending on particular voltages placed on the gate bodies.

According to one specific embodiment of the present invention, one quantized region is formed between two heterojunction tunneling barriers. In this embodiment, current can flow by tunneling through the quantized region upon application of the appropriate potential to the gate body overlying the quantized region.

According to another embodiment of the present invention, a plurality of quantized regions may be formed in a row between a plurality of heterojunction tunneling barriers. In this embodiment, current can tunnel through the plurality of quantized regions only when the plurality of gate bodies overlying the plurality of quantized regions align the states of all of the quantized regions.

An important technical advantage of the switching device of the present invention is the fact that it utilizes heterojunction tunneling barriers. These physical tunneling barriers extend the device operating temperature from cryogenic temperatures (less than approximately 77K) to room temperature and above and allow for precise and reproducible quantum structures. Another important technical advantage of the present invention is the use of a plurality of quantized regions connected in "series" This "series" connection provides for switching devices that may be controlled by a plurality of gate bodies Thus, current can tunnel through this "series" connection of quantized regions when potentials on the gate bodies appropriately align the quantum states within the quantized region.

BRIEF DESCRIPTION OF THE DRAWINGS

A more complete understanding of the present invention may be derived by referring to the detailed description and claims when considered in connection with the accompanying drawings, in which like reference numbers indicate like features and wherein:

DETAILED DESCRIPTION OF THE INVENTION

The preferred embodiment of the present invention and its advantages are best understood by referring to FIGS. 1 through 6 of the drawings, like numerals being used for like and corresponding parts of the various drawings.

Figure 1:
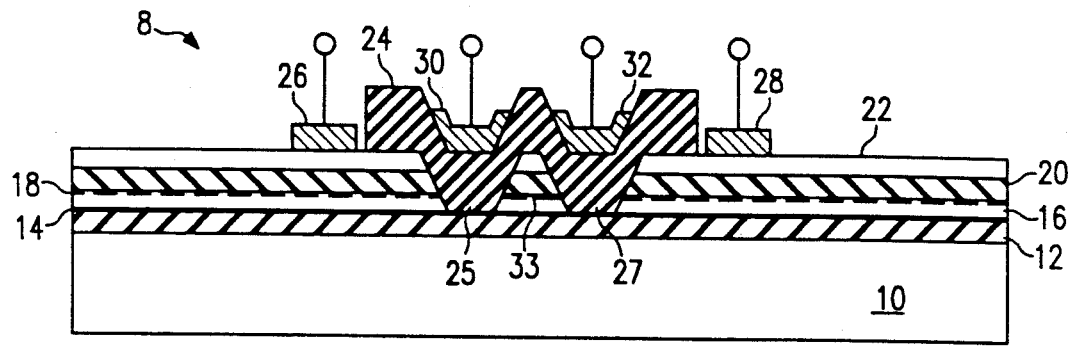
FIG. 1 is a highly magnified schematic cross-sectional view of a lateral resonant tunneling transistor with heterojunction barriers fabricated according to the present invention.

FIG. 1 is an exemplary cross-sectional illustration of a lateral resonant tunneling transistor with heterojunction barriers. The illustration is not to scale, certain dimensions having been greatly exaggerated or diminished for clarity. The transistor, indicated generally at 8, is grown in the preferred embodiment on a semi-insulating indium phosphide substrate 10. Other possible substrates that could be used for the invention are silicon, gallium phosphide, germanium, gallium arsenide, indium arsenide, aluminum antimonide, and cadmium telluride. The selection of the substrate or base layer material will determine the heterojunction systems that can be used to form the present invention, since these must be lattice-matched or pseudomorphic to the substrate 10. The term "pseudomorphic" refers to a layer under strain with its natural lattice constant constrained to that of the substrate.

A low conductivity, high (wide) band gap barrier 12 is grown on substrate 10. Where substrate 10 is indium phosphide, barrier 12 may comprise an epitaxially-grown layer of lattice-matching indium aluminum arsenide or indium phosphide and is used to reduce defect density and confine carriers in 2DEG 18 (to be discussed). Where substrate 10 is gallium arsenide, barrier 12 may comprise an epitaxially grown layer of gallium arsenide.

An etch stop 14 may be grown over barrier 12 to serve as an etch stop for a later described etching and may be about 10 nm thick. Etch stop 14 may comprise an epitaxially grown layer of aluminum arsenide. Overlying etch stop 14, a quantum layer 16 may be epitaxially grown. Quantum layer 16 may comprise a 30 nm layer of indium gallium arsenide Next, an epitaxially grown barrier 20 is formed over quantum layer 16. Barrier layer 20 should comprise a lattice-matched semiconductor layer having a band gap greater than that of quantum layer 16. Furthermore, barrier layer 20 is doped with n-type impurities, such as silicon, and may be formed of a 20 nm thick layer of indium aluminum arsenide, for example. Finally, a lattice-matched semiconductor, such as indium gallium arsenide, may be epitaxially grown over barrier 20 to form contact layer 22.

In a preferred embodiment, a compound of $In_{0.53}Ga_{0.47}As$ would be used for layers 16 and 22. The transistor may be grown in successive layers in a molecular beam epitaxy reactor such as a Riber 2300. After an etching, to be described later, a heterojunction barrier 24 is formed by patterning, etching and regrowth to take the shape shown in FIG. 1. Heterojunction barrier 24 may comprise indium phosphide regrown through a molecular beam epitaxy process. A conductive material may then be deposited after patterning and etching to form source, gate and drain contacts 26, 28, 30, and 32. Source contact 26 is ohmically contacted to quantum layer 16 through contact layer 22 and barrier 20 on one side of heterojunction barrier 24. On the other side, drain contact 28 may be ohmically contacted in the same way to quantum layer 16 through contact layer 22. Gate contacts 30 and 32 form Schottky contacts to heterojunction barrier 24 as shown in FIG. 1 to form a gate structure. Contacts 26, 28, 30, and 32, may all be formed of aluminum or other conductive materials, for example, composite metals such as chromium/gold or titanium/platinum/gold.

The dashed line of FIG. 1 illustrates a two dimensional electron gas (2DEG) region 18 formed in the upper layer of quantum layer 16. 2DEG region 18 is formed because of the doping of barrier 20 and the difference in the band gap energies of barrier 20 and quantum layer 16. N-type impurities, which have been doped into barrier 20 at a concentration of about $1 \times 10^{18} cm^{-3}$, will migrate to the top layer of quantum layer 16 since the band gap of quantum layer 16 is lower than that of barrier 20. Creation of 2DEG region 18 is desirable because of the transport properties of an electron gas, which allows, for example, for high speed operation of transistors. 2DEG 18 forms the channel for this device through which the primary current flow occurs.

Heterojunction barrier 24 is formed so as to comprise two non-horizontal (having a substantial vertical component) potential barriers 25 and 27 through 2DEG 18 in quantum layer 16. Barriers 25 and 27 extend above and join above the face of contact layer 22 to form heterojunction barrier 24. With this structure, a laterally quantized volume is formed between barriers 25 and 27. The width of barriers 25 and 27 in quantum layer 16 and 2DEG 18 may be on the order of 10 nm. The distance of 2DEG 18 in quantum layer 16 between barriers 25 and 27 is sufficiently small so as to allow for quantum effects within a two-dimensionally constrained quantum region 33 may be on the order of 10–15 nm. If the depth of transistor 8 in the dimension perpendicular to the plane of the page is sufficiently small, the volume of 2DEG 18 in quantum layer 16 between barriers 25 and 27 will be a quantum dot. If the depth of transistor 8 and the direction perpendicular to the plane of the page is not sufficiently small as to quantize that region in that direction, then the area of 2DEG 18 in quantum layer 16 between barriers 25 and 27 will be a quantum wire.

In operation, a potential on the order of 1 volt is applied between source contact 26 and drain contact 28. By applying appropriate potentials on the order of 0-1 volt to gate contacts 30 and 32, the quantum state of quantum region 33 can be adjusted to align with potential electron energies available at the source and drain. Thus, by applying the appropriate potential to gate contacts 30 and 32, current can be made to resonantly tunnel through quantum region 33 and barriers 25 and 27. Electrons flowing between the source and the drain and tunneling through the quantum region will flow through 2DEG region 18. As can be seen, a switching transistor has been produced. Current will flow between the source and the drain if one or more appropriate "ON" voltages are applied to gate contacts 30 and 32, with each "ON" voltage causing alignment of a quantum state in region 33 with available energy states in layer 16 outside of barriers 25 and 27.

It will be recognized by those skilled in the art that the reference to particular semiconductor materials in the description of transistor 8 are for purposes of teaching the preferred embodiment. Other semiconductor materials may be used to create a lateral resonant tunneling transistor with heterojunction barriers disclosed by the present invention. For example, a substrate such as semi-insulating gallium arsenide could be used without departing from the teaching of the present invention. Similarly, quantum layer 16 could comprise an epitaxially grown layer of gallium arsenide. Barrier layers 12 and 20, rather than being formed of indium aluminum arsenide, could be formed of aluminum gallium arsenide. Moreover, etch stop layer 14 is not necessary to the operation of the device, but is merely convenient in the fabrication thereof, and therefore can be left out altogether.

As another example of how different semiconductor materials may be used in the present invention without departing from the teaching herein, heterojunction barrier 24 may comprise an epitaxially regrown layer of aluminum gallium arsenide. It is also significant that barrier layer 12 may be eliminated if a semiconductor substrate is chosen that has a high enough band gap and/or has a low conductivity. In such a case, the substrate would have a low enough intrinsic conductivity to prevent electrons from conducting around heterojunction barrier 24 (i.e., with reference to FIG. 1, underneath barrier 25 and 27). As an example, a substrate formed of gallium arsenide could be used to eliminate barrier 12. In that case, quantum layer 16 would be formed directly over substrate 10.

Figure 2:
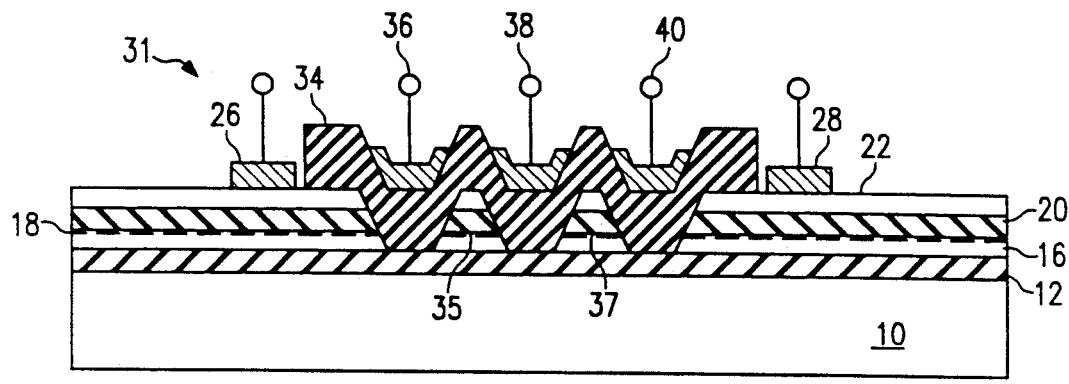
FIG. 2 is a schematic cross-sectional view of a lateral resonant tunneling transistor with heterojunction barriers and a plurality of quantized regions fabricated according to the present invention.

Referring now to FIG. 2, a lateral resonant tunneling transistor 31 comprising two quantum regions is schematically illustrated. As in transistor 8, transistor 31 may comprise two barrier layers 12 and 20 surrounding 2DEG 18 in quantum layer 16. In transistor 31, an etch stop layer is not necessary to the present invention but is convenient in the fabrication thereof. In transistor 31, barrier layer 12, quantum layer 16, barrier layer 20, and contact layer 22 are successively and epitaxially grown on a semi-insulating substrate 10. The dimensions of the layers and structures of transistor 31 are similar to those discussed in connection with transistor 8.

In transistor 31, three orifices are etched through layers 22, 20, 18, and 16, and a non-horizontal heterojunction potential barrier 34 is grown in the three orifices to form two quantum regions 35 and 37. For particular potentials placed between source contact 26 and drain contact 28, electrons will tunnel through the three non-horizontal physical potential barriers formed by heterojunction barrier 34, assuming that certain preselected voltages placed on gate contacts 36, 38, and 40. The quantum states of quantum regions 35 and 37 may be modulated by electric fields generated by placing preselected potentials on gate contacts 36, 38, and 40. If the quantum states within quantum regions 35 and 37 are not aligned with the occupied energy states of electrons available at source contact 26 and unoccupied states in drain contact 28, current will not flow between source contact 26 and drain contact 28. Therefore, gate contacts 36, 38, and 40 can be used to switch current "ON" and "OFF" between source contact 26 and drain contact 28.

Use of physical heterojunction barriers as tunneling barriers, rather than depletion regions as barriers, avoids significant temperature limitations present in depletion barrier quantum devices. By use of physical potential barriers, the location and size of quantum regions are specifically and sharply defined. Thus, quantum states within the quantum regions may be precisely modulated by use of electric fields. Moreover, the size of the potential barriers and quantum regions of the present invention, because they are physically delineated, are not dependent on difficult-to-reproduce impurity concentrations, as are depletion barrier-type quantum devices.

As can be seen in FIGS. 1 and 2, one embodiment of the invention relates to a transistor that has significant applications in digital electronic circuits. By applying particular voltages to the gate contacts shown in FIGS. 1 and 2, current flow between source contacts and drain contacts may be switched "ON" and "OFF". Thus, the gate contacts act as digital signal lines.

In a device such as transistor 31 of FIG. 2, as has been discussed, current will flow between source contact 26 and drain contact 28 if the quantum states within quantum regions 35 and 37 are aligned with the available energy states of the electrons available at source contact 26 and drain contact 28. Quantum regions 35 and 37 may be made to be different sizes, such that different electric fields will be required within each quantum region to align at least one quantum state in each region with a quantum state in the other region as well as an available electron energy state in each of the source and drain, such that current can tunnel between source contact 26 and drain contact 28. Thus, for example, an electric field may be generated within quantum region 35 to align one of its quantum states with one of the available states of electrons at source contact 26 and drain contact 28. However, current will not flow unless at least one quantum state of quantum region 37 is also aligned with one of the available electron states in both the source and drain. By making quantum regions 35 and 37 different sizes, preselected different potentials on the order of 0-1 volts placed on the gate structure formed by gate contacts 36, 38, and 40 will align quantum states of quantum regions 35 and 37 so as to allow electron tunneling between source contact 26 and drain contact 28.

As has been shown, controlling the size of quantum regions 35 and 37 allows different electric fields to be used to align the quantum states within those regions. Thus, using transistor 31 as an example, gate contacts 36, 38, and 40 may be considered classical digital inputs. Current will flow between source contact 26 and drain contact 28 only when appropriate potentials are placed on those gate contacts. The size of the quantum regions may be changed by increasing the distance between the non-horizontal physical heterojunction tunneling barriers of heterojunction barrier 34.

Figure 3:
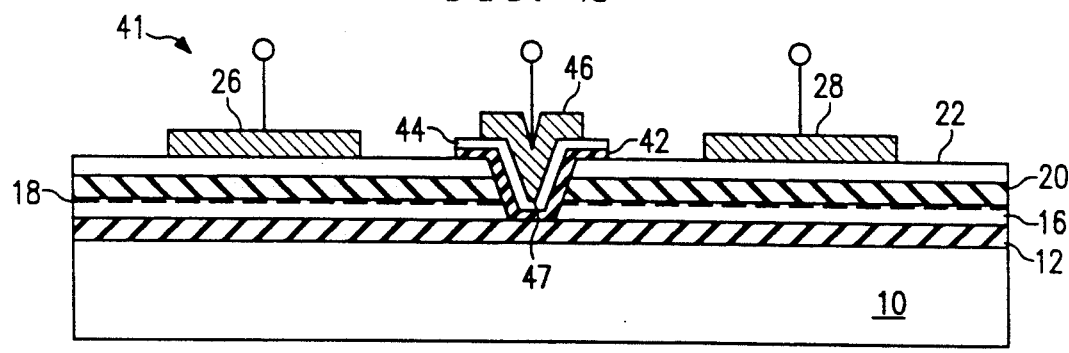
FIG. 3 is a schematic cross-sectional view of another lateral resonant tunneling transistor with heterojunction barriers fabricated with an atomic layer epitaxy process.

Referring now to FIG. 3, another embodiment of the present invention, transistor 41, is schematically illustrated. A heterojunction barrier 42 is grown on the surface of a trench by an atomic layer epitaxy process, and may be on the order of 5 nm thick. The trench may be on the order of 20 nm thick in quantum layer 16. As can be seen in FIG. 3, heterojunction barrier 42 extends from the surface of contact layer 22 and downward along the surface of trench 43 to the bottom of quantum layer 16. For a description of the atomic layer epitaxy process, see the paper by Ide, McDermott, Hashemi, and Bedair, "Sidewall Growth by Atomic Layer Epitaxy," *Appl. Phys. Lett.* 53 (23), Dec. 5, 1988, pp. 2314-2316.

Also using atomic layer epitaxy, conducting layer 44 is grown over heterojunction barrier 42, and may be on the order of 25 nm thick. Gate contact 46 is then deposited on conducting layer 44. By this process, quantum region 47 is formed between the non-horizontal portions of heterojunction barrier 42.

By applying a potential on the order of 0-1 volt to gate contact 46, the levels of quantum states within quantum region 47 can be adjusted. When a quantum state in quantum region 47 is aligned with one of the available energy states of electrons at source contact 26 and drain contact 28, electrons can tunnel through quantum region 47 and heterojunction barrier 42. In such a case, electrons would flow along 2DEG region 18, would tunnel through one of the non-horizontal portions of heterojunction barrier 42, through the bottom layer of conducting layer 44, through the other substantially vertical portion of heterojunction barrier 42, and back into the 2DEG region 18.

In transistor 41, quantum layer 16 may comprise a semiconductor material such as gallium arsenide. Conducting layer 44 should be formed out of the same material as quantum layer 16. Regions 40 and 42 may be formed out of aluminum gallium arsenide. Those skilled in the art will recognize that other semiconductor materials can be used in transistor 41 without departing from the teachings of the present invention. In the transistor of FIG. 3, no etch stop layer has been represented. However, an etch stop layer such as that represented in FIG. 1 (etch stop layer 14) may be included to facilitate the etching of the trench. Heterojunction barrier 42 in transistor 41 may comprise a semiconductor such as aluminum gallium arsenide, because of its wide band gap in relation to a material used for quantum layer 16 and conducting layer 44, such as gallium arsenide.

As another example, substrate 10 could be formed of gallium arsenide, which, as described above would preclude the need for barrier 12. Barrier 20 could be formed of aluminum gallium arsenide, and quantum layer 16 and contact layer 22 of gallium arsenide. Heterojunction barrier 42 could be formed of aluminum gallium arsenide, and conducting layer 44 of gallium arsenide. Furthermore, quantum layer 16 can be grown over an etch stop to facilitate fabrication, and the etch stop can be formed of aluminum arsenide, aluminum gallium arsenide or indium gallium arsenide, for example.

A plurality of trenches may be etched for transistor 41, followed by regrowth of a plurality of heterojunction barriers similar to heterojunction barrier 42 and a plurality of conducting layers such as conducting layer 44, and by connection of gate bodies to respective conducting layers. In such a case, quantum regions will be formed alternately in each conducting layer 44 and in each portion of 2DEG 18 in quantum layer 16 between each filled trench. Thus, a multiple input switching device such as that discussed in connection with FIG. 2 may be realized with the principles discussed in connection with FIG. 3.

Figure 4:
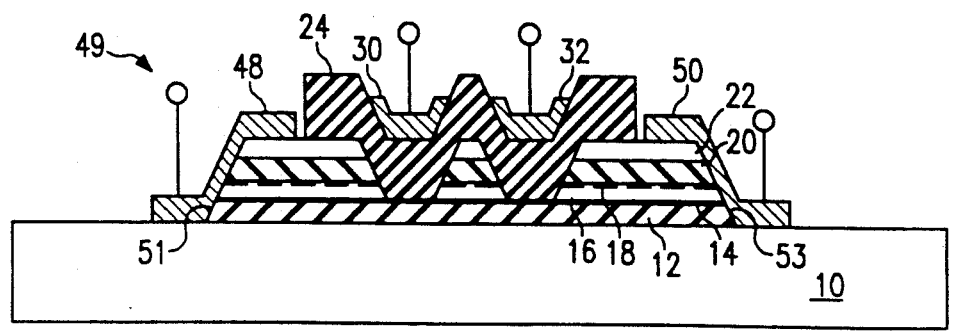
FIG. 4 is a schematic cross-sectional view of a lateral resonant tunneling transistor with heterojunction barriers and sidewall connections for drain and source fabricated according to the present invention.

Referring now to FIG. 4, a transistor 49 is schematically illustrated, which is a variation of transistor 8 in that the transistor has been separated from other devices that may be formed in semiconductor layers 12 through 22. The separation may be realized by etching through contact layer 22 and downward to substrate 10 to form sidewalls 51 and 53. This allows electrical isolation of transistor 49 from other devices that may be formed in semiconductor layers 12 through 22. Furthermore, source contact 48 and drain contact 50 may be contacted along etch walls 51 and 53, respectively, to allow for excellent electrical contact for electron flow between source contact 48 and drain contact 50 through 2 DEG 18 in quantum layer 16.

Figure 5A:
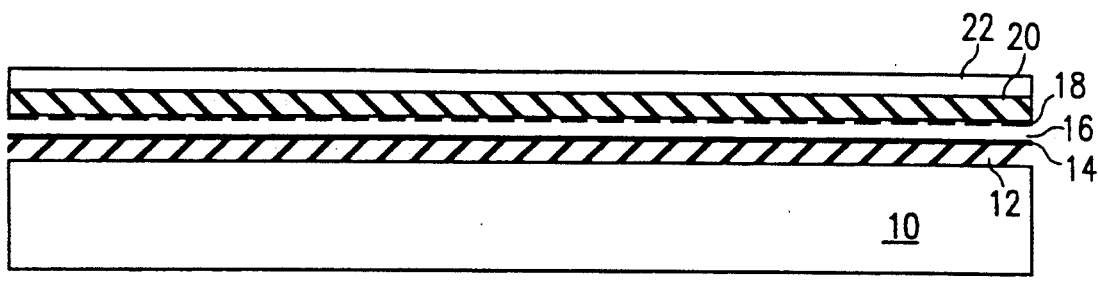
FIGS. 5a, 5b, 5c, and 5d are schematic cross-sectional views which show successive steps by which a lateral resonant tunneling transistor with heterojunction barriers may be fabricated according to the present invention.
Figure 5B:
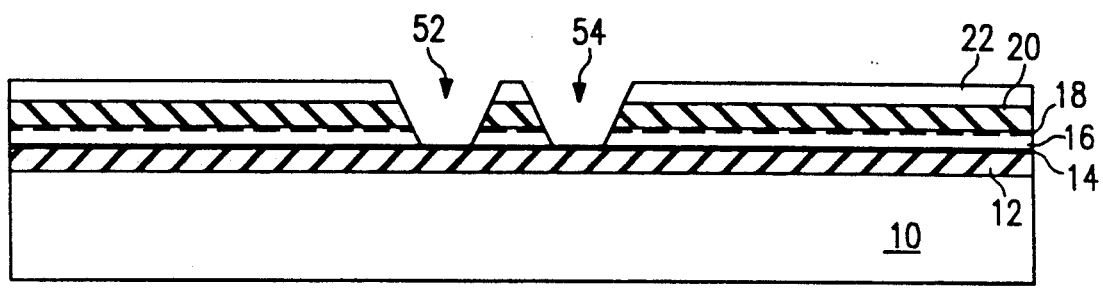
Figure 5C:
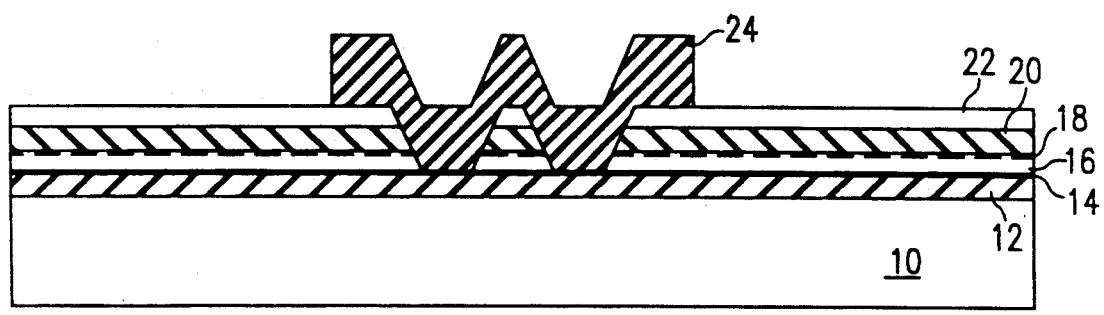

FIGS. 5a, 5b, 5c, and 5d illustrate a process by which transistor 8 may be formed. FIG. 5a illustrates the various semiconductor layers described in connection with transistor 8 in FIG. 1. After forming the semiconductor layers shown in FIG. 5a, trenches 52 and 54 are etched downward through contact layer 22, barrier layer 20, and quantum layer 16. Etch stop layer 14 provides an excellent stop for formation of trenches 52 and 54. Trenches 52 and 54 may be formed by using a high resolution lithography such as electron beam lithography to form a mask, and then etching using etch processes such as reactive ion etching or selective etching (such as a succinic acid etchant disclosed by Broekaert and Fonstad, *Technical Digest of Electronic Devices, Meeting,* 1990 (IEEE press, NY) pp. 231-34).

Heterojunction barrier layer 24 (including barriers 25 and 27) is then grown in trenches 52 and 54 and to overlying contact layer 22. As has been discussed, heterojunction barrier 24 may be grown with relatively high band gap semiconductor materials such as indium phosphide or aluminum gallium arsenide, for example. Heterojunction barrier 24 may be grown with a process such as molecular beam epitaxy, and then may be patterned and etched to define its lateral limits.

Figure 5D:
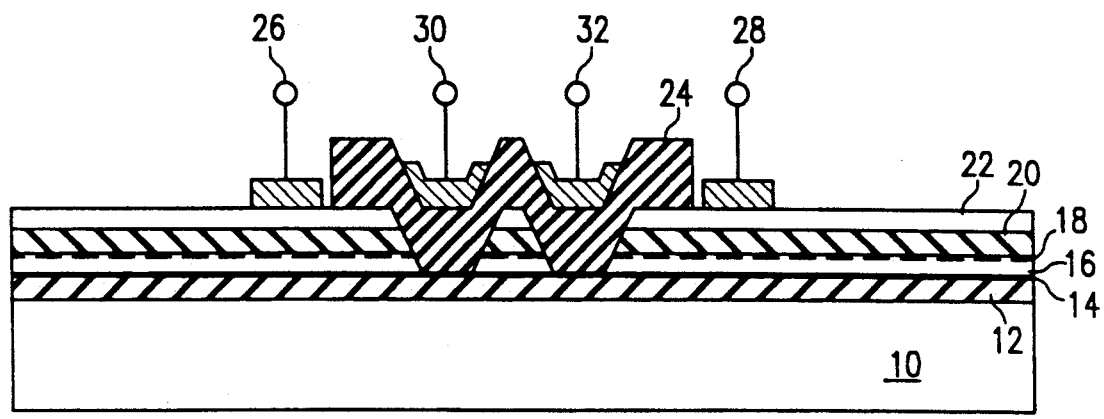

Source contact 26 and drain contact 28 may be deposited after patterning to ohmically contact layer 22 on opposite sides of heterojunction barrier 24, as shown in FIG. 5d. Gate contacts 30 and 32 are likewise formed to contact the naturally formed grooves of heterojunction barrier 24. The grooves are formed since heterojunction barrier 24 is regrown over a portion of contact layer 22 as well as in trenches 52 and 54. Consequently, grooves will be formed over the portion of the regrowth grown out of trenches 52 and 54, bounded by the regrowth areas regrown over contact layer 22. Regrowing heterojunction barrier 24 in the manner described facilitates the deposition of gate contacts 30 and 32, since the reliability of successful deposition of contacts in such grooves is higher than that of deposition on mesas or above thin quantum regions, such as 33, 35, or 37. However, other means may be used to connect gate connections so as to allow modulation of the electric field in the quantum region formed between barriers 25 and 27 without departing from the teachings of the present invention.

Figure 6:
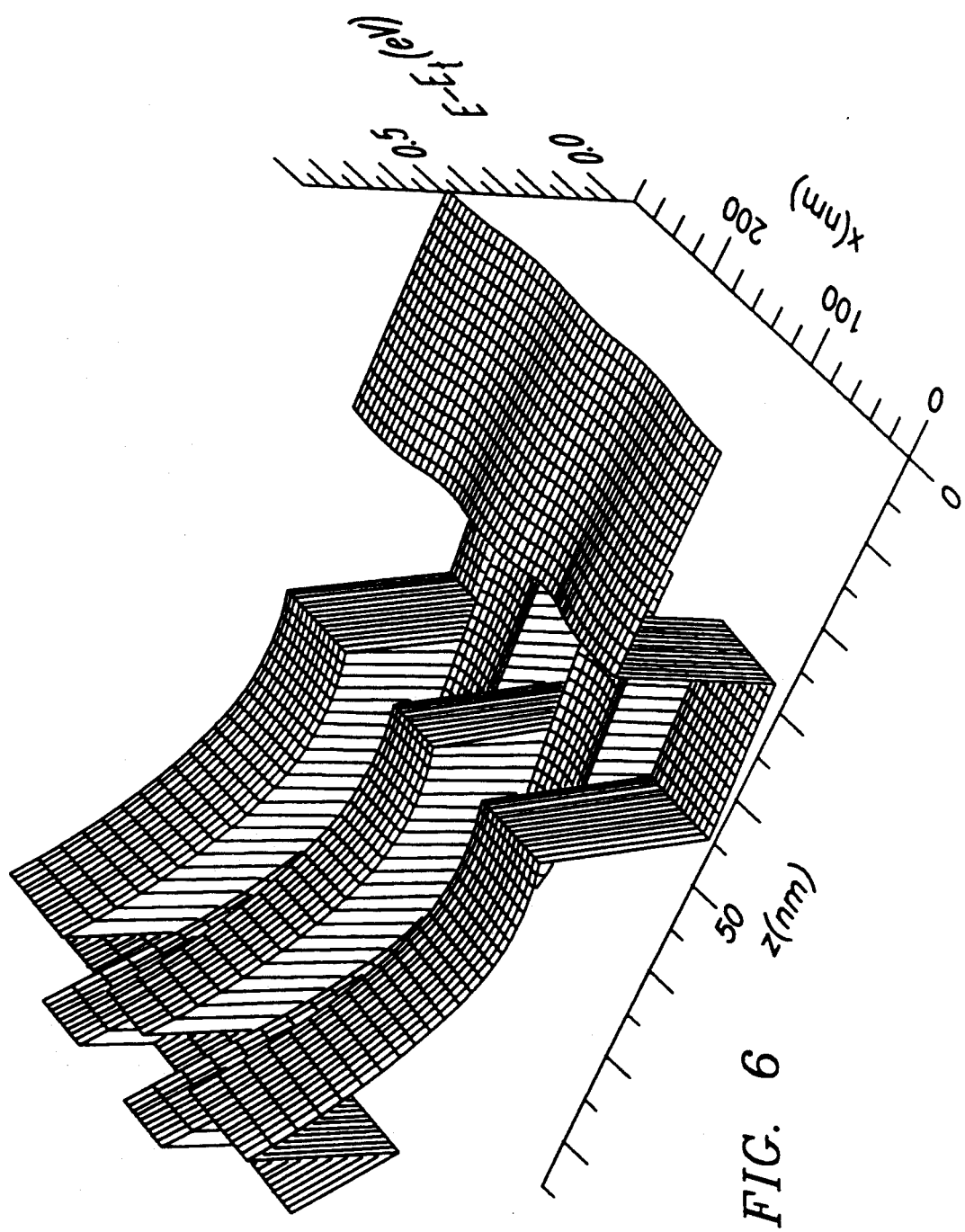
FIG. 6 is a three-dimensional graph representing electrical potentials within a device according to the present invention.

FIG. 6 is a graph of a three-dimensional representation for the structure and electron potentials of transistor 8 of FIG. 1. The dimensions represented in FIG. 6 are "z" and "x", the physical dimensions of the plane of the page of FIG. 1, and the third dimension is that of the electron potential surface of transistor 8. As can be seen from FIG. 6, an electron in quantum layer 16 will be bounded by the high potential surfaces of barrier layers 12 and 20. Electrons tend to conduct at the line z=45nm, as this is the position of 2DEG 18. Furthermore, the potential surface of barriers 25 and 27 can be seen as potential barriers in quantum layer 16. FIG. 6 is included to show the relationship of the electron potential surfaces of the various materials used to form transistor 8.

Although the present invention and its advantages have been described in detail, it should be understood that various changes, substitutions and alterations can be made herein without departing from the spirit and scope of the invention as defined by the appended claims.

What is claimed is:

1. A method for fabricating a lateral resonant tunneling transistor, comprising the steps of:
    providing a semiinsulating substrate;
    forming a first barrier layer on a face of said substrate;
    forming a quantum layer on said first barrier layer;
    forming a second barrier layer on said quantum layer;
    etching first and second spaced-apart trenches through said second barrier layer and said quantum layer to said first barrier layer to define a quantum structure between said trenches;
    regrowing a semiconductor in said trenches having a higher band gap than said quantum layer;
    forming a gate structure on said regrown semiconductor so as to be operable to apply a predetermined potential to said regrown semiconductor; and
    forming source and drain contacts laterally to the regrown semiconductor to be electrically coupled to said quantum layer external to said trenches.

2. The method of claim 1, and further comprising the step of doping said second barrier layer to be of a first conductivity type, such that a two-dimensional electron gas is formed in said quantum layer.

3. The method of claim 1, and further comprising the step of forming a contact layer on said second barrier layer, such that said spaced-apart trenches are etched to said first barrier layer through said contact layer.

4. The method of claim 1, and further comprising the steps of:
    regrowing said semiconductor in said spaced-apart trenches such that said semiconductor extends and joins above said barrier layer; and
    forming gate contacts over said spaced-apart trenches.

* * * * *